United States Patent
Yao et al.

(10) Patent No.: US 7,825,036 B2
(45) Date of Patent: Nov. 2, 2010

(54) METHOD OF SYNTHESIZING SILICON WIRES

(75) Inventors: Yuan Yao, Beijing (CN); Li-Guo Xu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 89 days.

(21) Appl. No.: 11/525,440

(22) Filed: Sep. 22, 2006

(65) Prior Publication Data

US 2007/0166899 A1    Jul. 19, 2007

(30) Foreign Application Priority Data

Jan. 14, 2006    (CN)    ..................... 2006 1 0032947

(51) Int. Cl.
   *H01L 21/469*    (2006.01)
(52) U.S. Cl. ................ 438/769; 438/774; 977/762; 977/769
(58) Field of Classification Search ............... 438/798, 438/775, 769; 977/762; 257/E39, E51.038–E51.04, 257/E23.074, E23.165
   See application file for complete search history.

(56) References Cited

U.S. PATENT DOCUMENTS 6,162,365 A * 12/2000 Bhatt et al. .................. 216/13
6,248,674 B1 * 6/2001 Kamins et al. .............. 438/798

2007/0281156 A1 * 12/2007 Lieber et al. ................ 428/373

FOREIGN PATENT DOCUMENTS

JP    2005-46928    2/2005

OTHER PUBLICATIONS

Young Hwan Kim et al. (Colloids and Surfaces A: Physicochem. Eng. Aspects 284-285 (2006) 364-368).*
Ming Liu, Lei-Mei Sheng, Shuai-Ping Ge and Shou-Shan Fan, "Enhanced Field Emission Properties of Vertically-oriented Silicon Nanowire Arrays", Journal of Vacuum Science and Technology, Jul./Aug. 2005, pp. 312-314, vol. 25, Issue 4, China.
Jian-Gang Liu, Xin-Hui Fan, Jian Chen, Ling-Min Yu and Wen Yan, "Synthesis of Silicon Nanowires by Thermally Evaporating Copper Powders", Journal of Materials Science & Engineering, Aug. 2005, pp. 589-592, vol. 23, Issue 4, China.

* cited by examiner

*Primary Examiner*—Thanh V Pham
*Assistant Examiner*—Tony Tran
(74) *Attorney, Agent, or Firm*—Jeffrey T. Knapp

(57) ABSTRACT

A method of synthesizing silicon wires generally includes the steps of: providing a substrate; forming a copper catalyst particle layer on a top surface of the substrate; heating the reactive device at a temperature of above 450° C. in a flowing protective gas; and introducing a mixture of a protective gas and a silicon-based reactive gas at a temperature of above 450° C. at a pressure of below 700 Torr, thereby forming the silicon wires on the substrate.

4 Claims, 3 Drawing Sheets

METHOD OF SYNTHESIZING SILICON WIRES

BACKGROUND

1. Technical Field

The invention relates generally to methods of synthesizing silicon wires and, particularly, to a method of synthesizing silicon wires that employs metallic catalysts.

2. Discussion of Related Art

Since silicon is one of the most favored materials in the semiconductor industry and as it has been used in the IC industry for many years, much attention has already been paid to the research and synthesis of silicon wires. As early as in 1964, micrometer-scaled silicon whiskers grown on silicon substrates were synthesized by a Vapor-liquid-solid (VLS) method. Nowadays, VLS method is an important way to synthesize silicon wires. In this method, metals, generally selected from gold (Au), nickel (Ni) and iron (Fe), are employed as catalysts.

Although Au is a usual catalyst for silicon wires by the VLS method, the use thereof is limited by its expense. Furthermore, in the VLS method employing Au as a catalyst, poisonous and/or noxious matter is prone to be formed in the process, thereby forming pollutants that have to captured and, thus, increasing the environmental control costs associated therewith. The introduction of cheaper metals, selected from Fe and Ni, to catalyze the silicon wires has proven difficult over at least two issues. On the one hand, in the VLS method employing Fe or Ni as catalysts, high synthesizing temperature (i.e., above 1000° C.) is needed, thereby increasing the cost of the fabrication. On the other hand, the catalysts of Fe or Ni are prone to render unwanted impurities within semiconductor elements, thereby decreasing the performance thereof.

What is needed, therefore, is a method of synthesizing silicon wires that overcomes above-mentioned shortcomings, thus allowing them to be produced in a cost-effective manner.

SUMMARY

A method of synthesizing silicon wires generally includes the steps of:

(i) providing a substrate;

(ii) forming a Cu (i.e., copper) catalyst particle layer on a top surface of the substrate; and (iii) heating the substrate with Cu catalyst particle layer thereon and introducing a protective gas and a silicon-based reactive gas at a temperature of above 450° C., thereby forming the silicon wires on the substrate.

An alternative method of synthesizing silicon wires generally includes the steps of:

(i) providing a substrate;

(ii) forming a powder layer containing a Cu compound or a layer of a liquid solution containing a Cu compound on a top surface of the substrate; and (iii) heating the substrate with the powder layer or liquid-solution layer thereon, and introducing a protective gas and a silicon-based reactive gas at a temperature of above 450° C., thereby forming the silicon wires on the substrate.

Other advantages and novel features of the present method will become more apparent from the following detailed description of preferred embodiments when taken in conjunction with the accompanying drawings.

BRIEF DESCRIPTION OF THE DRAWINGS

Many aspects of the present method can be better understood with reference to the following drawings. The components in the drawings are not necessarily to scale, the emphasis instead being placed upon clearly illustrating the principles of the present method. Moreover, in the drawings, like reference numerals designate corresponding parts throughout the several views.

The exemplifications set out herein illustrate at least one preferred embodiment of the present method, in one form, and such exemplifications are not to be construed as limiting the scope of such a method in any manner.

DETAILED DESCRIPTION

Reference will now be made to the drawings to describe the synthesizing of silicon wires employing Cu as catalyst according to the present method, in detail.

Figure 1:
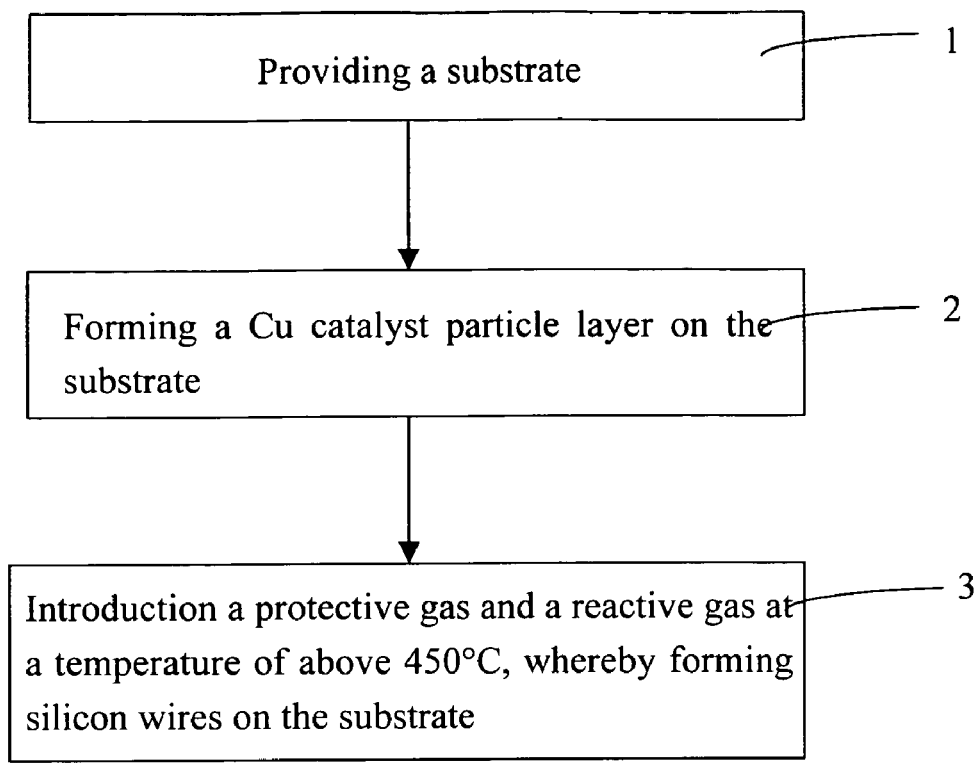
FIG. 1 is a flow chart showing successive stages in a method of synthesizing silicon wires.
Figure 2:
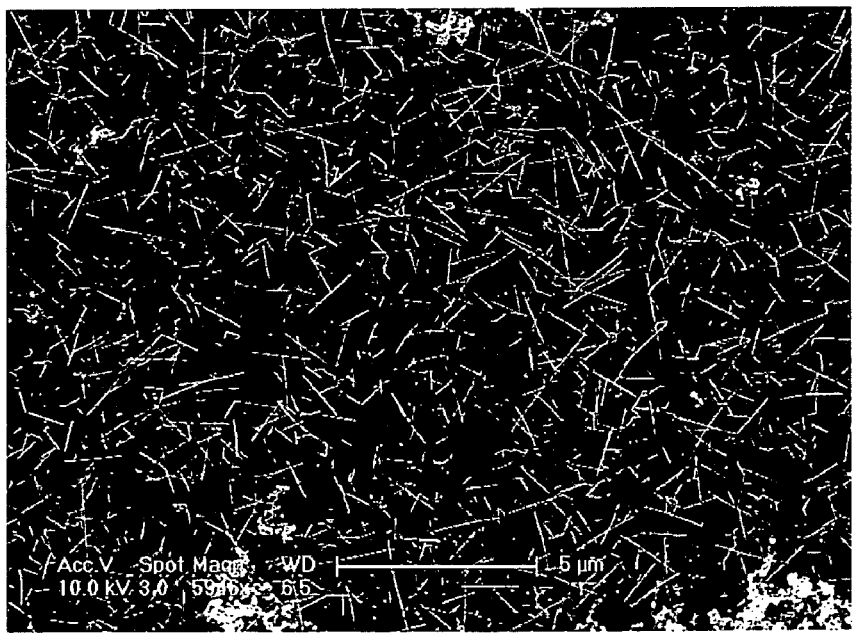
FIG. 2 is a scanning electron microscope (SEM) photo of nano-scaled silicon wires synthesized by the present method.
Figure 3:
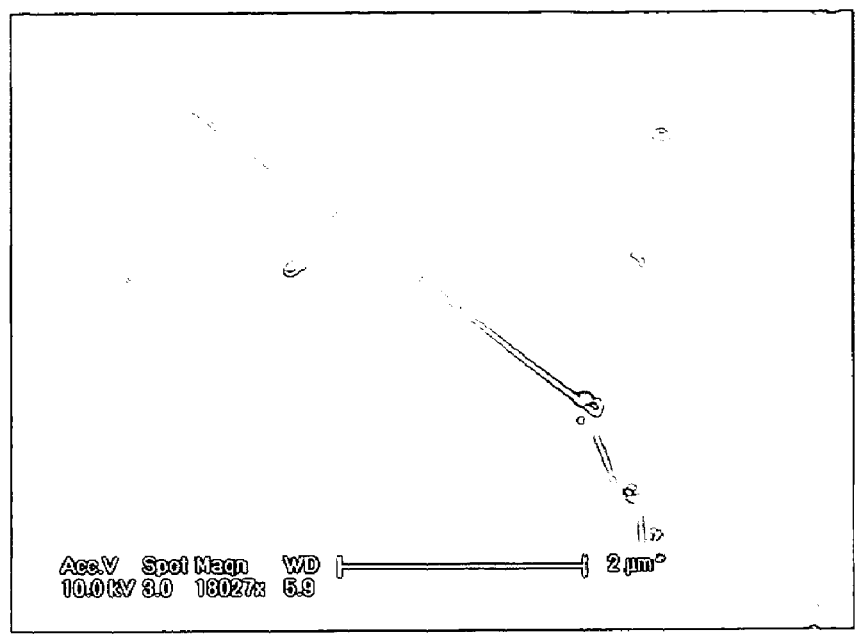
FIG. 3 is an enlarged photo of FIG. 2, showing one of the silicon wires of FIG. 2.
Figure 4:
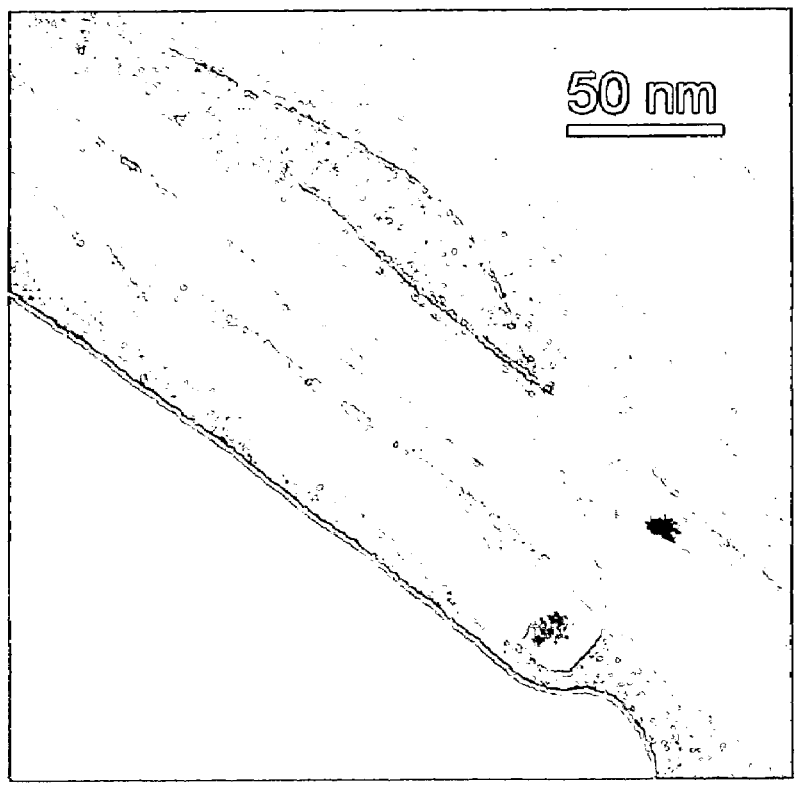
FIG. 4 is a transmission electron microscope (TEM) photo of nano-scaled silicon wires synthesized by the present method, showing two silicon wires, one of which has a black head on an end thereof.
Figure 5:
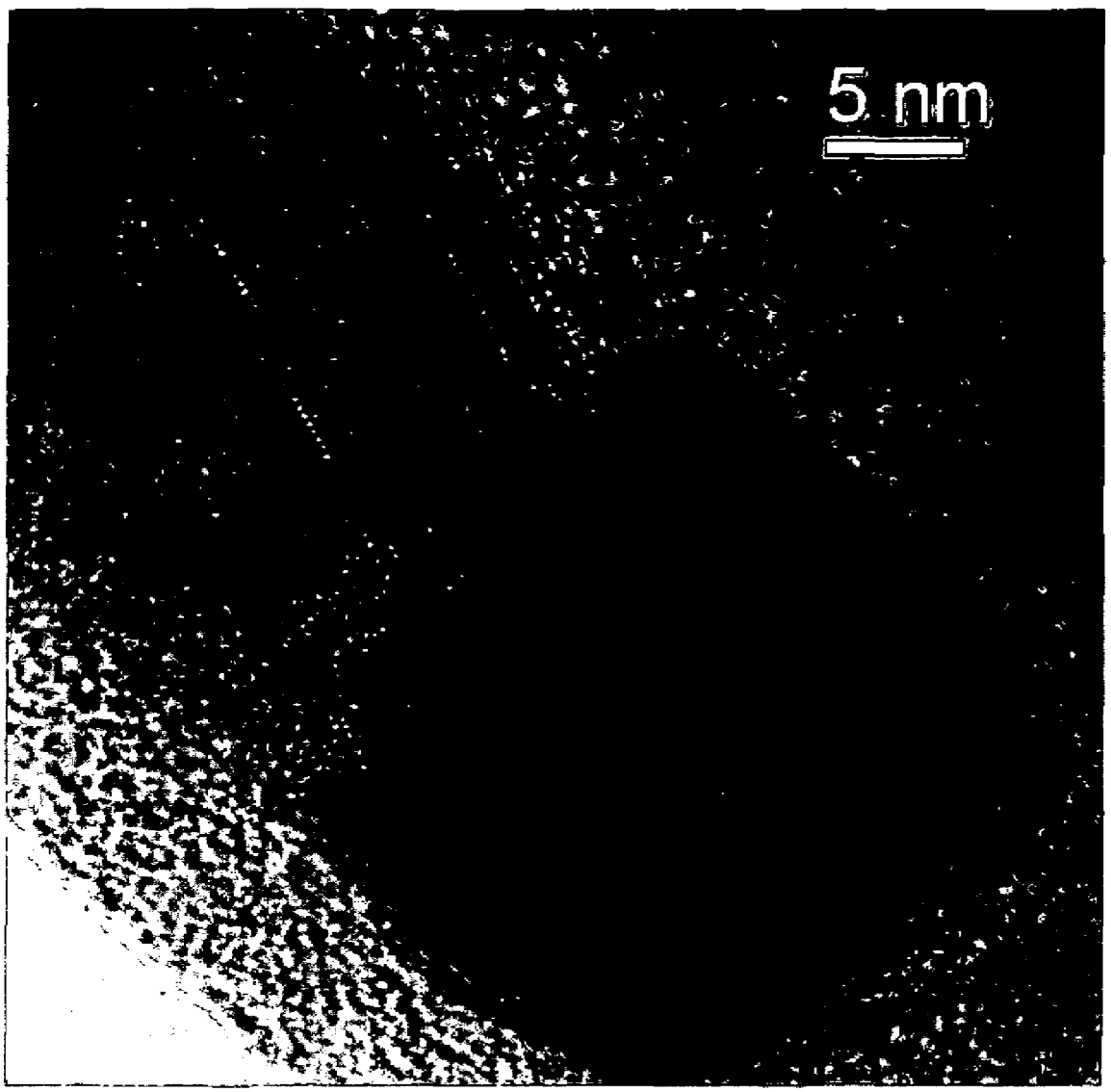
FIG. 5 is an enlarged photo of FIG. 4, showing one of the nano-scaled silicon wires.

Referring to FIG. 1, a substrate is firstly provided. The substrate is advantageously made from a non-metallic material (e.g. silicon, silicon dioxide, quartz, glass, etc).

Next, a Cu catalyst particle layer is formed on a top surface of the substrate. According to the sizes of the needed silicon wires, the Cu catalyst particles can be selected from one of micro-scale Cu particles, submicro-scale Cu particles, and nano-scale particles, respectively, as the particle size (i.e., diameter) will directly impact the diameter of the wire produced therewith (i.e., a nano-sized copper particle is used to catalyze the growth of a nano-sized diameter silicon wire).

A method of the formation of the Cu catalyst layer generally includes the steps of: (a) depositing a Cu layer on the top surface of the substrate by a physical vapor deposition (PVD) method or a chemical vapor deposition (CVD) method; (b) annealing the substrate with the Cu layer thereon in air at a temperature of about 300° C. to about 400° C. for a sufficient period of time (e.g., about 20 minutes to about 10 hours), thereby oxidizing the Cu layer and forming a Cu oxide particle layer; and (c) heating the substrate up to a predetermined temperature (i.e., above about 500° C.) in a flow of a protective gas (e.g. noble gas, nitrogen) to reduce the Cu oxide particle layer into a Cu particle layer, thereby arriving at the desired Cu catalyst particle layer on the substrate, after having started with an essentially continuous layer of Cu.

An alternative method of the formation of the Cu catalyst layer is to directly deposit Cu particles on the top surface of the substrate by plating or sputtering. Before the deposition of the Cu catalyst particles, the Cu catalyst particles can be formed by an appropriate technology (e.g., a Microwave Plasma chemical vapor deposition (MWPCVD) method, a low pressure flame combustion method, a sol-gel transformation method, etc.).

Another alternative method of the formation of the Cu catalyst layer includes the steps of: (d) applying a powder layer containing a Cu compound (e.g. Cupric Chloride ($CuCl_2$), Cupric Sulfate ($CuSO_4$), etc.) or a liquid-solution layer containing a Cu compound on the top surface of the substrate; and (e) heating the substrate with the powder layer or the liquid-solution layer to decompose the Cu compound to thereby form a Cu catalyst particle layer on the substrate. The step (e) of heating the substrate is selective. The Cu compound could be decomposed to form the Cu catalyst particle layer by a heating step described below, and the step (e) could be omitted.

Then, the substrate with the Cu catalyst particle layer, which is put into a refractory (e.g., quartz, alumina, or platinum) boat, is placed into a high temperature reactive device (e.g., a high-temperature tube furnace, a plasma-enhanced CVD reactive furnace, a hot-filament CVD reactive furnace, etc.). The high temperature reactive device is then heated up to a predetermined temperature (i.e., above about 450° C.) in a flowing protective gas. The protective gas can be a noble gas (e.g., argon (Ar) or helium (He)) and/or nitrogen ($N_2$). Preferably, Ar is used as the protective gas. A mixture of the protective gas and a silicon-based reactive gas is then introduced into the high temperature reactive device for 5~30 minutes at a pressure of below about 700 Torr, thereby forming the silicon wires on the substrate. The reactive gas, which can be readily decomposed into silicon at the predetermined temperature, is advantageously selected from silane ($SiH_4$) and silicon monoxide.

Referring to FIGS. 2 to 5, nano-scaled silicon wires formed by the present method are shown. A diameter of each of the nano-scaled silicon wires is in a range of about 10 nanometers to about 100 nanometers, and a diameter of most of the nano-scaled silicon wires is in the range from about 20 nanometers to about 40 nanometers. Each of the nano-scaled silicon wires has a black head, which is formed of an alloy consisting essentially of copper and silicon. The nano-scaled silicon wires shown in FIGS. 2-5 were synthesized using $SiH_4$ as the reactive gas at a temperature of 450° C.~500° C. and a pressure of about 1 Torr to about 100 Torr.

In the present method, the conventional Fe or Ni is replaced with Cu as the catalyst material used to synthesize silicon wires. Thus, the reactive temperature of synthesis of silicon wires is lower, thereby decreasing the requirement for the thermal performance of the high temperature reactive device. Furthermore, copper is a cheap metal that is readily processed. Therefore, the synthesizing cost of silicon wires is decreased. Moreover, many semiconductor elements employ conductive traces that are made from Cu. As such, given the known compatibility of copper with silicon-based semiconductor elements, the semiconductor elements are unlikely to be adversely polluted by the Cu catalysts, thereby ensuring the performance of the semiconductor elements.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

We claim:

1. A synthesis method of silicon wires comprising:
   providing a substrate;
   forming a layer containing a cupric chloride or cupric sulfate on a top surface of the substrate, the layer containing the cupric chloride or cupric sulfate being in a form of one of a powder and a liquid solution; and
   heating the substrate with the layer containing the cupric chloride or cupric sulfate thereon in a flowing protective gas to decompose the cupric chloride or cupric sulfate to thereby form a copper catalyst particle layer on the substrate; and
   introducing a mixture of the protective gas and a silicon-containing reactive gas at a temperature of above about 450° C. and at a pressure of below about 700 Torr, thereby forming the silicon wires on the substrate.

2. The synthesis method of silicon wires as described in claim 1, wherein the substrate is comprised of one of silicon, silicon dioxide, quartz and glass.

3. The synthesis method of silicon wires as described in claim 1, wherein the protective gas is comprised of a gas selected from argon, nitrogen, and helium.

4. The synthesis method of silicon wires as described in claim 1, wherein the silicon-based reactive gas is comprised of a gas selected from silane and silicon monoxide.

* * * * *